(12) United States Patent
Park (10) Patent No.: US 11,183,862 B2
(45) Date of Patent: Nov. 23, 2021

(54) SYSTEM OF CONTROLLING OUTPUT OF HIGH VOLTAGE BATTERY FOR ECO-FRIENDLY VEHICLE

(71) Applicants: HYUNDAI MOTOR COMPANY, Seoul (KR); KIA MOTORS CORPORATION, Seoul (KR)

(72) Inventor: Hyun Soo Park, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 274 days.

(21) Appl. No.: 16/393,069

(22) Filed: Apr. 24, 2019

(65) Prior Publication Data
US 2020/0185944 A1 Jun. 11, 2020

(30) Foreign Application Priority Data
Dec. 11, 2018 (KR) .................. 10-2018-0158964

(51) Int. Cl.
| | | |
|---|---|---|
| *H02J 7/00* | (2006.01) | |
| *G01R 31/382* | (2019.01) | |
| *H01M 10/48* | (2006.01) | |
| *H01M 10/42* | (2006.01) | |
| *B60L 58/13* | (2019.01) | |

(52) U.S. Cl.
CPC .......... *H02J 7/0063* (2013.01); *B60L 58/13* (2019.02); *G01R 31/382* (2019.01); *H01M 10/425* (2013.01); *H01M 10/486* (2013.01); *H01M 2010/4271* (2013.01); *H01M 2220/20* (2013.01); *H02J 2007/0067* (2013.01)

(58) Field of Classification Search
CPC .......... H02J 7/0063; H02J 2007/0067; G01R 31/382; B60L 58/13; H01M 10/425; H01M 10/486; H01M 2010/4271; H01M 2220/20
USPC ....................................... 320/136
See application file for complete search history.

(56) References Cited

U.S. PATENT DOCUMENTS 5,625,272 A * 4/1997 Takahashi ............... B60L 53/00
320/116
6,107,779 A * 8/2000 Hara ................... G01R 31/3832
320/132

(Continued)

FOREIGN PATENT DOCUMENTS

| KR | 10-2013-0112563 A | 10/2013 |
| KR | 10-2017-0012304 A | 2/2017 |
| KR | 10-2017-0096409 A | 8/2017 |

*Primary Examiner* — Suresh Memula
(74) *Attorney, Agent, or Firm* — Morgan, Lewis & Bockius LLP (57) ABSTRACT

A system of controlling an output of a high voltage battery for an eco-friendly vehicle includes: the high voltage battery mounted in the eco-friendly vehicle; a storage configured to store information on maximum available charge and discharge power according to a temperature and a state of charge (SOC) of the high voltage battery; and a controller configured to control available charge power and available discharge power of the high voltage battery based on at least one of information on a charge duration and a discharge duration of the high voltage battery, information on an accumulated charge amount and an accumulated discharge amount of the high voltage battery, and information on a requested output amount of the vehicle.

19 Claims, 7 Drawing Sheets

(56) References Cited

U.S. PATENT DOCUMENTS

| | | | |
|---|---|---|---|
| 6,710,575 B2* | 3/2004 | Youn | B60L 3/0046 |
| | | | 320/104 |
| 10,876,510 B2* | 12/2020 | Ciaccio | H02J 7/1438 |
| 2002/0062183 A1* | 5/2002 | Yamaguchi | B60W 20/10 |
| | | | 701/22 |
| 2004/0065489 A1* | 4/2004 | Aberle | B60W 10/26 |
| | | | 180/65.1 |
| 2009/0001927 A1* | 1/2009 | Stamos | H02J 7/0047 |
| | | | 320/106 |
| 2011/0043165 A1* | 2/2011 | Kinser | H02J 7/042 |
| | | | 320/109 |
| 2015/0028808 A1* | 1/2015 | Bernardi | B60L 11/1809 |
| | | | 320/109 |
| 2019/0178951 A1* | 6/2019 | Cha | G01R 31/3842 |
| 2019/0257890 A1* | 8/2019 | Cha | G01R 31/3842 |

* cited by examiner

FIG. 1

--PRIOR ART--

| BMS DISCHARGE AVAILABLE POWER | | | | | | |
|---|---|---|---|---|---|---|
| | SOC | | | | | |
| TEMP. | 0 | 20 | 40 | 60 | 80 | 100 |
| -30 | A11 | A12 | A13 | A14 | A15 | A16 |
| -20 | A21 | A22 | A23 | A24 | A25 | A26 |
| -10 | A31 | A32 | A33 | A34 | A35 | A36 |
| 0 | A41 | A42 | A43 | A44 | A45 | A46 |
| 10 | A51 | A52 | A53 | A54 | A55 | A56 |
| 20 | A61 | A62 | A63 | A64 | A65 | A66 |
| 30 | A71 | A72 | A73 | A74 | A75 | A76 |
| 40 | A81 | A82 | A83 | A84 | A85 | A86 |
| 50 | A91 | A92 | A93 | A94 | A95 | A96 |

| BMS CHARGE AVAILABLE CHARGE POWER | | | | | | |
|---|---|---|---|---|---|---|
| | SOC | | | | | |
| TEMP. | 0 | 20 | 40 | 60 | 80 | 100 |
| -30 | B11 | B12 | B13 | B14 | B15 | B16 |
| -20 | B21 | B22 | B23 | B24 | B25 | B26 |
| -10 | B31 | B32 | B33 | B34 | B35 | B36 |
| 0 | B41 | B42 | B43 | B44 | B45 | B46 |
| 10 | B51 | B52 | B53 | B54 | B55 | B56 |
| 20 | B61 | B62 | B63 | B64 | B65 | B66 |
| 30 | B71 | B72 | B73 | B74 | B75 | B76 |
| 40 | B81 | B82 | B83 | B84 | B85 | B86 |
| 50 | B91 | B92 | B93 | B94 | B95 | B96 |

SYSTEM OF CONTROLLING OUTPUT OF HIGH VOLTAGE BATTERY FOR ECO-FRIENDLY VEHICLE

CROSS REFERENCE TO RELATED APPLICATION

The present application claims the benefit of priority to Korean Patent Application No. 10-2018-0158964, filed on Dec. 11, 2018 with the Korean Intellectual Property Office, the entire contents of which is incorporated herein for all purposes by this reference.

TECHNICAL FIELD

The present disclosure relates to a system and a method of controlling an output of a high voltage battery for an eco-friendly vehicle, and more particularly, to a system of controlling an output of a high voltage battery for an eco-friendly vehicle that controls available charge and discharge power of the high voltage battery based on at least one information of information on a charge and discharge duration of the high voltage battery, information on an accumulated charge and discharge amount thereof, and information on a required output amount of the vehicle.

BACKGROUND

Recently, as interest in energy efficiency and environmental pollution problem has daily increased, it is required to develop an eco-friendly vehicle which may substantially replace an internal combustion engine vehicle. Such an eco-friendly vehicle is usually classified into an electric vehicle driven by fuel cells or electricity, and a hybrid vehicle driven by an engine and a battery.

Figure 1:
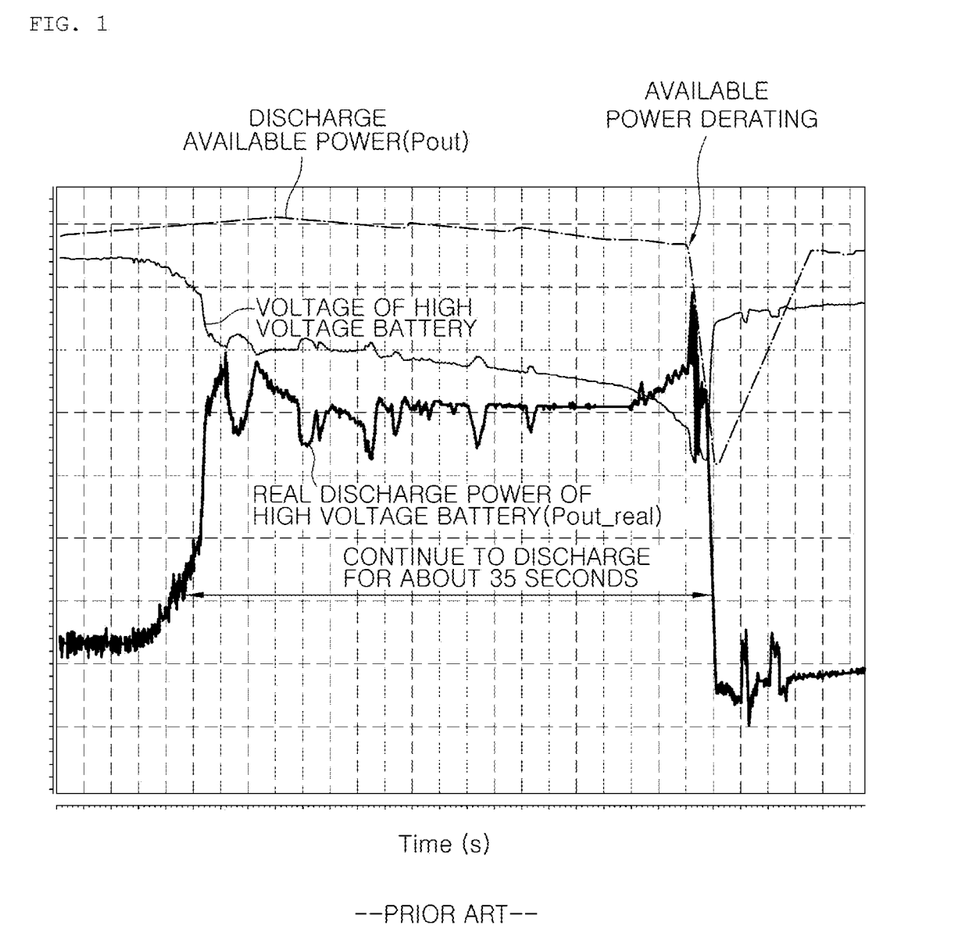
FIG. 1 is a graph illustrating data showing that an output of a high voltage battery is controlled according to a conventional system of controlling an output of a high voltage battery.

Meanwhile, it is very important to properly control a high voltage battery output of a high voltage battery in the eco-friendly vehicle. To this end, conventionally, an available charge and discharge power value of the high voltage battery according to a temperature or a state of charge (SOC) of the high voltage battery is previously stored in a map, and the output of the high voltage battery was controlled according to an available output power value according to the corresponding map. Here, the available charge and discharge power value stored in the map means a power value that may be continuously charged and discharged during a reference time, for example, 4 seconds for the hybrid vehicle and 10 seconds for the electric vehicle. Therefore, according to the conventional method, in the case of the hybrid vehicle, the charge and discharge is performed for 4 seconds or more, the previously stored power map becomes meaningless, and the high voltage battery was protected by abruptly limiting the available power using a real voltage value of the high voltage battery instead of an available power map after 4 seconds. However, the method has a problem that the battery voltage sharply drops when the discharge is performed for a long period of time even though the output of the high voltage battery is controlled by conforming to the available power map, thereby causing a situation in which the vehicle may not be driven, as illustrated in FIG. 1.

The contents described as the related art have been provided only to assist in understanding the background of the present disclosure and should not be considered as corresponding to the related art known to those having ordinary skill in the art.

SUMMARY

An object of the present disclosure is provide a system of controlling an output of a high voltage battery for an eco-friendly vehicle capable of proactively protecting a high voltage battery so that the high voltage battery does not reach a voltage upper and lower limit value thereof by controlling available charge and discharge power of the high voltage battery based on at least one information of information on a charge and discharge duration time of the high voltage battery, information on an accumulated charge and discharge amount thereof, and information on a required output amount of the vehicle, and capable of improving power performance by supplying in excess of available power as needed.

According to an exemplary embodiment of the present disclosure, a system of controlling an output of a high voltage battery for an eco-friendly vehicle may include: the high voltage battery mounted in the eco-friendly vehicle; a storage configured to store information on maximum available charge and discharge power according to a temperature and a state of charge (SOC) of the high voltage battery; and a controller configured to control available charge power and available discharge power of the high voltage battery based on at least one of information on a charge duration and a discharge duration of the high voltage battery, information on an accumulated charge and an accumulated discharge amount of the high voltage battery, and information on a requested output amount of the vehicle.

The controller may be further configured to calculate real discharge power of the high voltage battery as a percentage of the available discharge power according to a current temperature and a state of charge of the high voltage battery stored in the storage when the high voltage battery is in a state of discharge, and change the available discharge power of the high voltage battery based on the real discharge power of the high voltage battery and a discharge power limiting factor when the discharge duration exceeds a preset time.

The discharge power limiting factor may be calculated based on information on whether the high voltage battery has reached a lower limit value when the high voltage battery is controlled by the discharge duration of the high voltage battery, a current discharge amount of the high voltage battery, and limited available discharge power.

The preset time may vary depending on the real discharge power of the high voltage battery.

When the discharge duration of the high voltage battery is a preset value or less, the controller may be further configured to maintain the available discharge power of the high voltage battery at the maximum available discharge power according to the temperature and the state of charge of the high voltage battery pre-stored in the storage.

The controller may be further configured to calculate real charge power of the high voltage battery as a percentage of the available charge power according to a current temperature and a state of charge of the high voltage battery stored in the storage when the high voltage battery is in a state of charge, and change the available charge power of the high voltage battery based on the real charge power of the high voltage battery and a charge power limiting factor when the charge duration exceeds a preset time.

The discharge power limiting factor may be calculated based on information on whether the high voltage battery has reached an upper limit value when the high voltage battery is controlled by the charge duration of the high voltage battery, a current charge amount of the high voltage battery, and limited available charge power.

The preset time may vary depending on the real charge power of the high voltage battery.

When the charge duration of the high voltage battery is a preset value or less, the controller may be further configured to maintain the available charge power of the high voltage battery at the maximum available charge power according to the temperature and the state of charge of the high voltage battery pre-stored in the storage.

The controller may be further configured to calculate an accumulated discharge amount of the high voltage battery when the high voltage battery is in a state of discharge, calculates an exceed ratio of the accumulated discharge amount when the calculated accumulated discharge amount exceeds a preset accumulated discharge amount, and change the available discharge power of the high voltage battery based on real discharge power of the high voltage battery and a discharge power limiting factor.

The discharge power limiting factor may be calculated based on information on whether the high voltage battery has reached a lower limit value when the high voltage battery is controlled by the exceed ratio of the accumulated discharge amount of the high voltage battery and limited available discharge power.

When the calculated accumulated discharge amount is the preset accumulated discharge amount or less, the controller may be further configured to maintain the available discharge power of the high voltage battery at the maximum available discharge power according to the temperature and the state of charge of the high voltage battery pre-stored in the storage.

The controller may be further configured to calculate an accumulated charge amount of the high voltage battery when the high voltage battery is in a state of charge, calculates an exceed ratio of the accumulated charge amount when the calculated accumulated charge amount exceeds a preset accumulated charge amount, and change the available charge power of the high voltage battery based on real charge power of the high voltage battery and a charge power limiting factor.

The charge power limiting factor may be calculated based on information on whether the high voltage battery has reached an upper limit value when the high voltage battery is controlled by the exceed ratio of the accumulated charge amount of the high voltage battery and limited available charge power.

When the calculated accumulated charge amount is the preset accumulated charge amount or less, the controller may be further configured to maintain the available charge power of the high voltage battery at the maximum available charge power according to the temperature and the state of charge of the high voltage battery pre-stored in the storage.

The requested output amount of the vehicle may be determined based on at least one of vehicle speed information, accelerator pedaling amount information, and gradient information of a road on which the vehicle drives.

The requested output amount of the vehicle may be determined based on a learned driving pattern of a driver in addition to the at least one of the vehicle speed information, the accelerator pedaling amount information, and the gradient information of the road on which the vehicle drives.

When the requested output amount of the vehicle is a preset value or more, the controller may be further configured to change the available discharge power of the high voltage battery based on a time required for the requested output amount and a requested output amount changing factor.

The requested output changing factor may change depending on the requested output amount of the vehicle, and have a value of 1 or more.

It may be understood that the appended drawings are not necessarily to scale, presenting a somewhat simplified representation of various features illustrative of the basic principles of the disclosure. The specific design features of the present disclosure as disclosed herein, including, for example, specific dimensions, orientations, locations, and shapes will be determined in part by the particularly intended application and use environment. In the figures, reference numbers refer to the same or equivalent parts of the present disclosure throughout the several figures of the drawing.

DETAILED DESCRIPTION OF THE EMBODIMENTS

Hereinafter, a system of controlling an output of a high voltage battery for an eco-friendly vehicle according to exemplary embodiments of the present disclosure will be described with reference to the accompanying drawings. While the inventive concept(s) will be described in conjunction with the exemplary embodiments of the present disclosure, it will be understood that the present description is not intended to limit the inventive concept(s) to those exemplary embodiments. On the other hand, the inventive concept(s) is/are intended to cover not only the exemplary embodiments of the present disclosure, but also various alternatives, modifications, equivalents and other embodiments, which may be included within the spirit and scope of the inventive concept(s) as defined by the appended claims.

Figure 2:
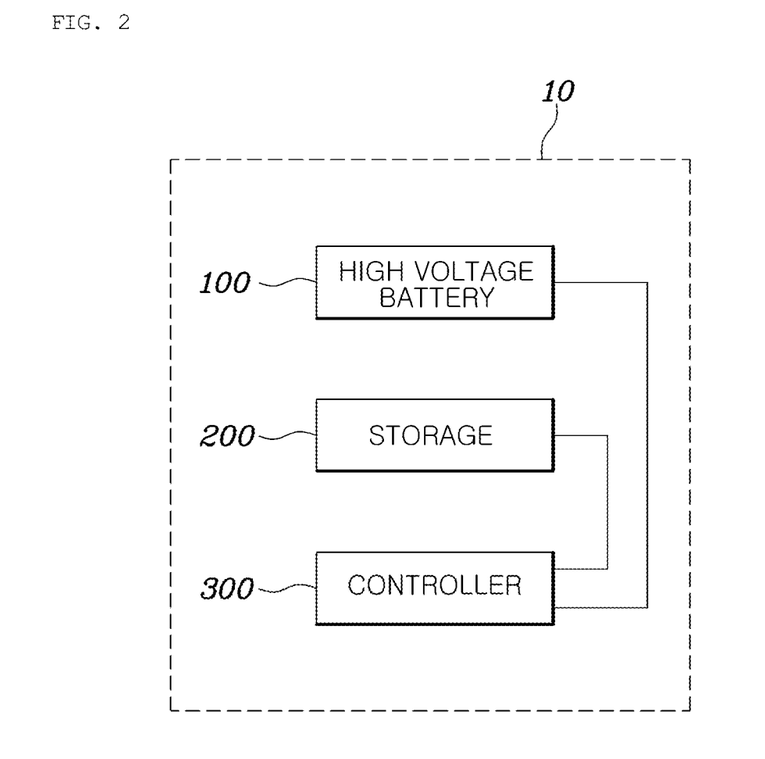
FIG. 2 is a block diagram illustrating a configuration of a system of controlling an output of a high voltage battery for an eco-friendly vehicle according to an exemplary embodiment of the present disclosure.
Figure 3:
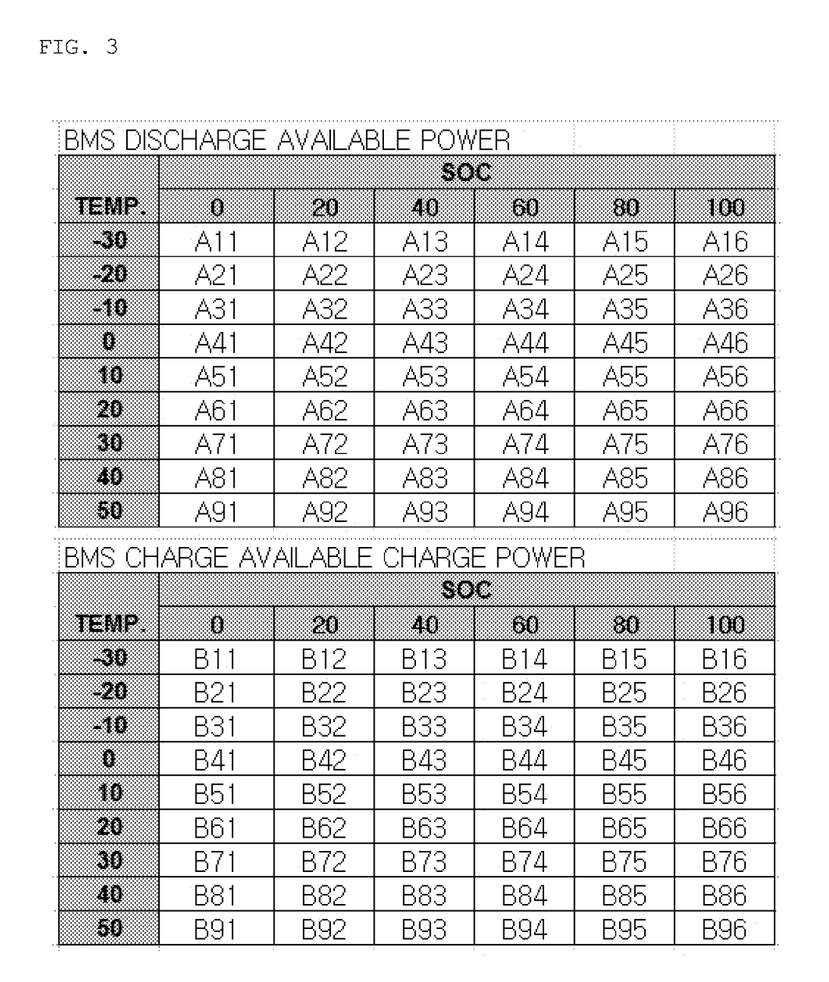
FIG. 3 is an available charge and discharge power table for each temperature and state of charge (SOC) of the high voltage battery stored in a storage of the system of controlling the output of the high voltage battery for the eco-friendly vehicle according to an exemplary embodiment of the present disclosure.
Figure 4:
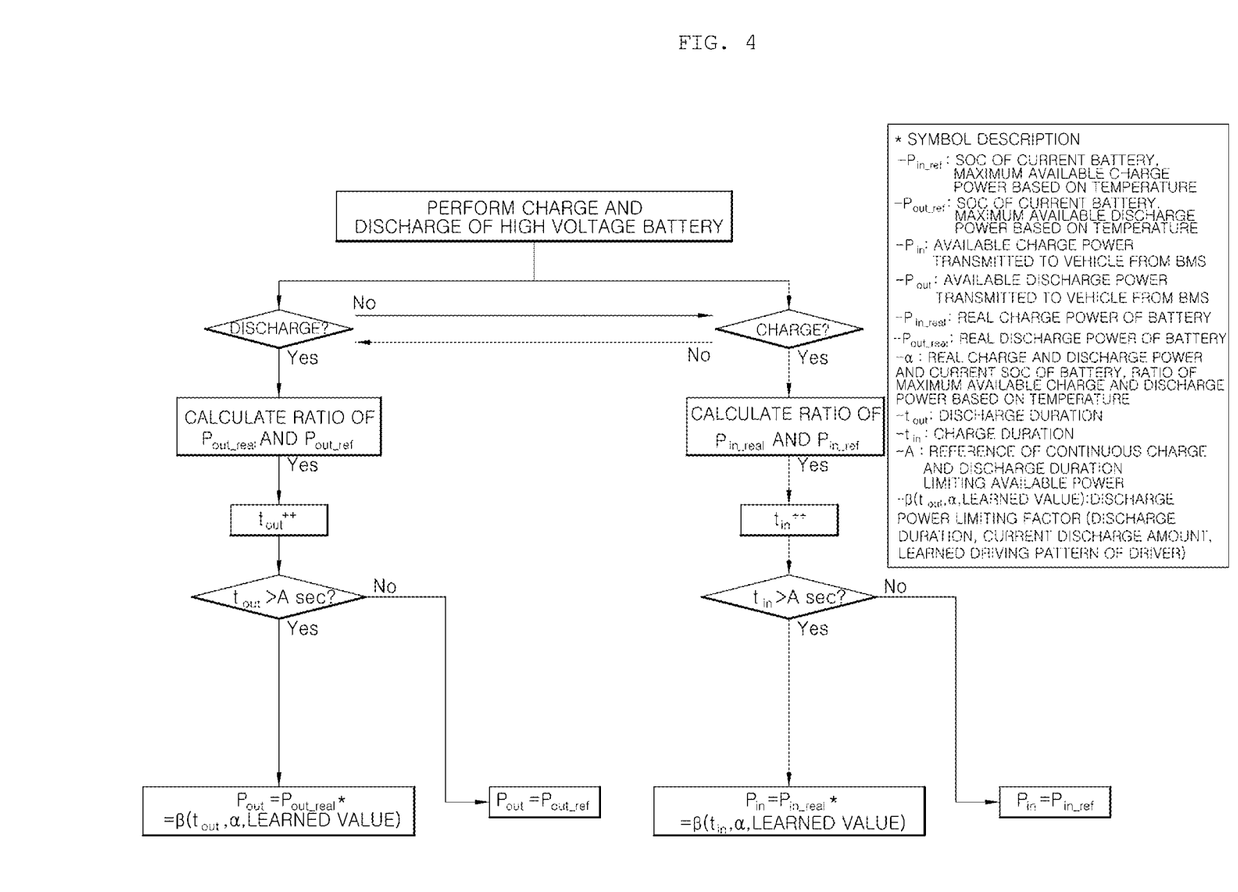
FIG. 4 is a flowchart illustrating that available power of the high voltage battery is changed based on a ratio of maximum available charge and discharge power according to a current temperature and state of charge (SOC) of the high voltage battery stored in the storage to real charge and discharge power, in the system of controlling the output of the high voltage battery for the eco-friendly vehicle according to an exemplary embodiment of the present disclosure.
Figure 5:
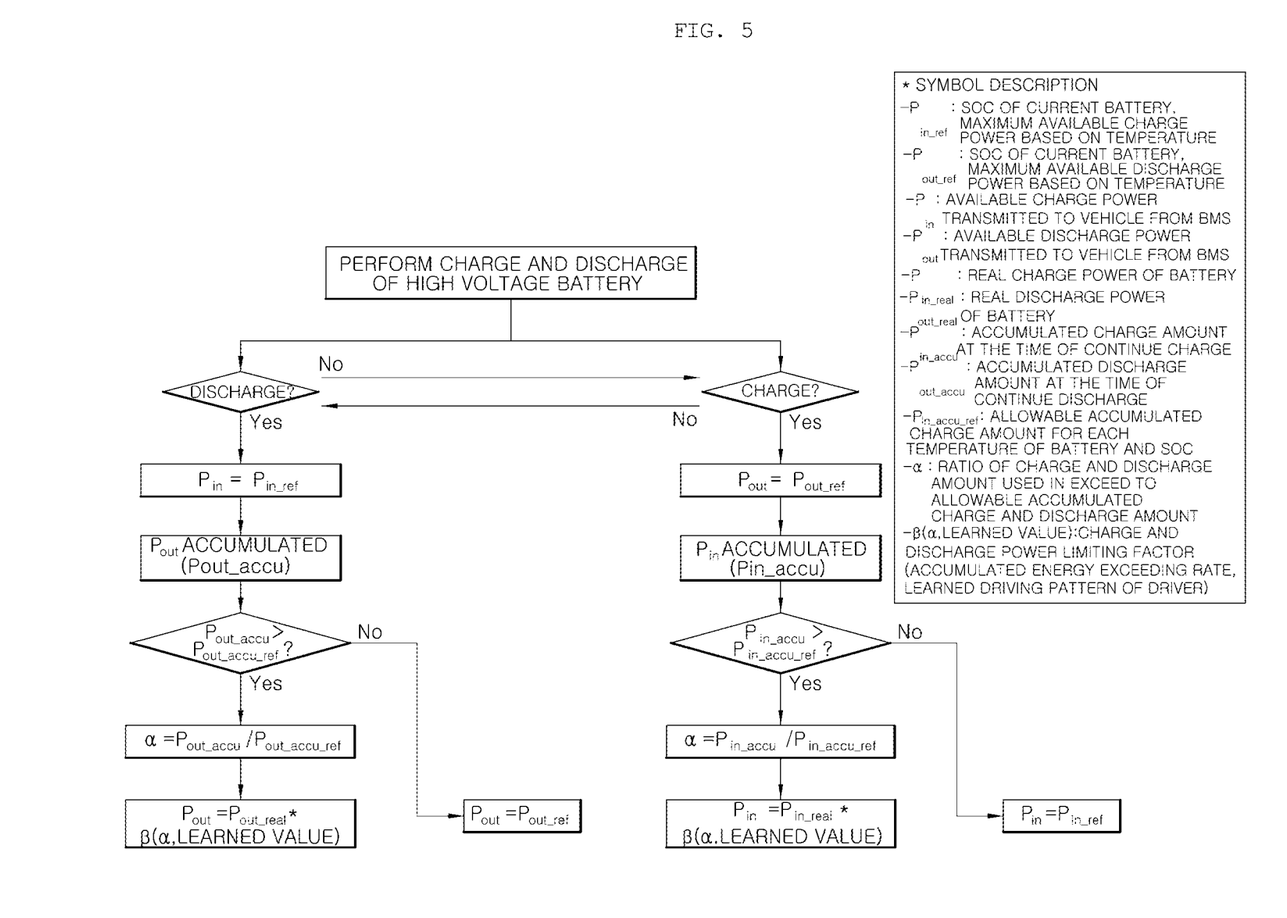
FIG. 5 is a flowchart illustrating that available power of the high voltage battery is changed based on a total accumulated charge and discharge amount of the high voltage battery, in the system of controlling the output of the high voltage battery for the eco-friendly vehicle according to an exemplary embodiment of the present disclosure.
Figure 6:
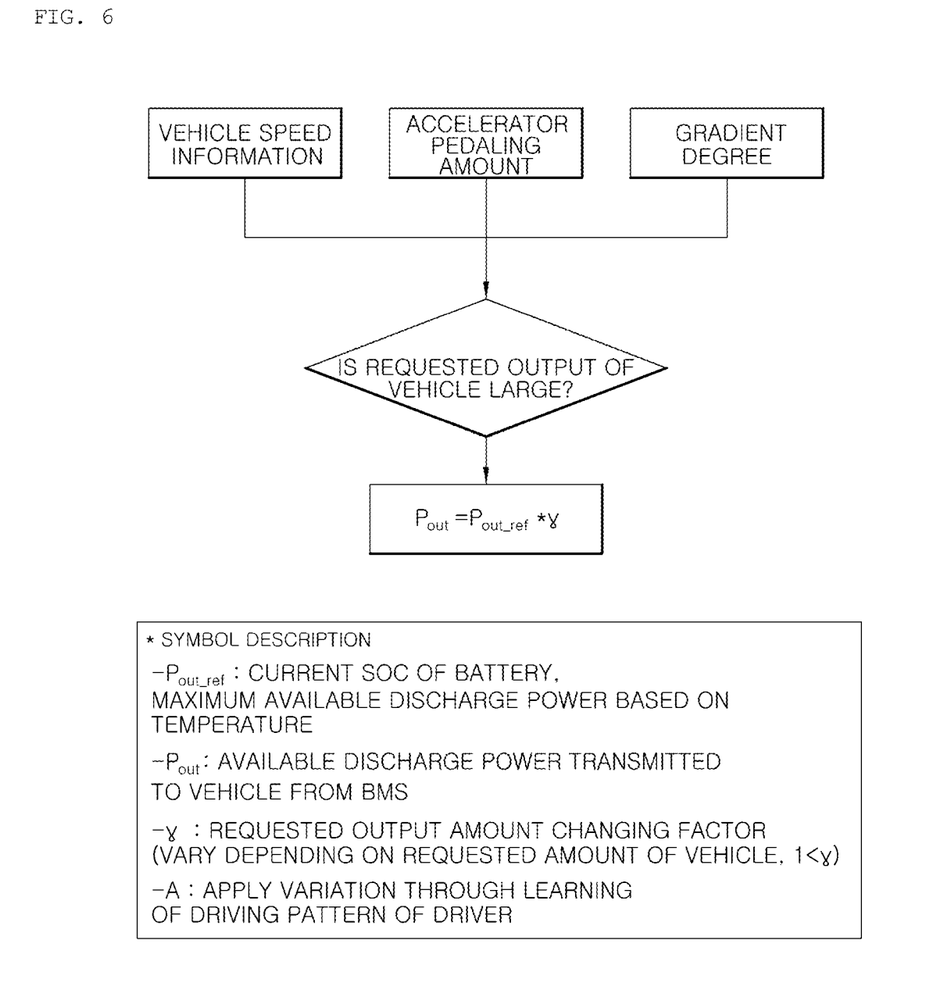
FIG. 6 is a flowchart illustrating that the available power of the high voltage battery is changed based on an output requesting amount of the vehicle, in the system of controlling the output of the high voltage battery for the eco-friendly vehicle according to an exemplary embodiment of the present disclosure.
Figure 7:
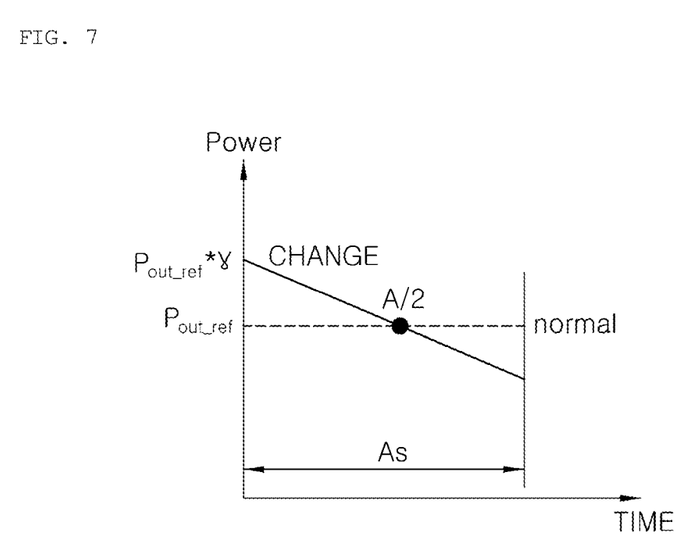
FIG. 7 is a flowchart illustrating the available power of the high voltage battery changed based on the output requesting amount of the vehicle, in the system of controlling the output of the high voltage battery for the eco-friendly vehicle according to an exemplary embodiment of the present disclosure.

FIG. 2 is a block diagram illustrating a configuration of a system of controlling an output of a high voltage battery for an eco-friendly vehicle according to an exemplary embodiment of the present disclosure, FIG. 3 is an available charge and discharge power table for each temperature and charged state of the high voltage battery stored in a storage, FIG. 4 is a flowchart illustrating that available power of the high voltage battery is changed based on a ratio of maximum available charge and discharge power according to a current temperature and charged state of the high voltage battery stored in the storage to real charge and discharge power, FIG. 5 is a flowchart illustrating that available power of the high voltage battery is changed based on a total accumulated charge and discharge amount of the high voltage battery, FIG. 6 is a flowchart illustrating that the available power of the high voltage battery is changed based on an output requesting amount of the vehicle, and FIG. 7 is a flowchart illustrating the available power of the high voltage battery changed based on the output requesting amount of the vehicle.

As illustrated in FIG. 2, a system of controlling an output of a high voltage battery for an eco-friendly vehicle according to an exemplary embodiment of the present disclosure may be configured to include a high voltage battery 100 mounted in an eco-friendly vehicle, a storage 200 in which information on maximum available charge and discharge power according to a temperature and state of charge (SOC) of the high voltage battery 100 is stored, and a controller 300 of controlling available charge and discharge power of the high voltage battery 100 based on at least one of information on a charge and discharge duration of the high voltage battery 100, information on an accumulated charge and discharge amount thereof, and information on a requested output amount of the vehicle.

The controller 300 according to an exemplary embodiment of the present disclosure may be implemented through a non-transitory memory (not shown) configured to store data with respect to algorithms configured to control operations of various components in the vehicle or software instructions reproducing the algorithms, and a processor (not shown) configured to pertain the operations described hereinafter by using the data stored in the memory. Herein, the memory and the processor may be implemented as separate chips. Alternatively, the memory and the processor may be implemented as a single chip integrated with each other. The processor may take the form of one or more processor(s).

The high voltage battery 100 serves to provide energy required to drive a motor mounted in the eco-friendly vehicle. Further, the energy provided from the high voltage battery 100 may be converted into a low voltage through a low voltage direct current (DC) converter and may be provided as the energy required to drive various electronic components mounted in the vehicle.

The storage 200 may store information on maximum charge and discharge power according to a temperature and state of charge (SOC) of the high voltage battery 100 as illustrated in FIG. 3. Further, the storage 200 may store a map in which road information including a driving pattern of a driver of the vehicle, a gradient of a road, and the like are stored.

The storage 200 may include at least one type of storage medium among a flash memory type, a hard disk type, a multimedia card micro type such as an SD or XD memory, a random access memory (RAM), a static RAM (SRAM), a read-only memory (ROM), an electrically erasable programmable read-only memory (EEPROM), a programmable read-only memory (PROM), a magnetic memory, a magnetic disk, and an optical disk.

Meanwhile, although not illustrated in detail in the drawings, the system of controlling the output of the high voltage battery 100 for the eco-friendly vehicle according to the present disclosure may be configure to further include a vehicle speed sensor for measuring a speed of the vehicle, an accelerator pedaling sensor for measuring an accelerator pedaling amount, and navigation for guiding a driving of the vehicle.

Hereinafter, how the controller 300 controls the available charge and discharge power of the high voltage battery 100 will be described in detail based on a ratio of maximum available charge and discharge power according to a current temperature and state of charge of the high voltage battery 100 stored in the storage 200 to real charge and discharge power with respect to FIG. 4.

As illustrated in FIG. 4, the controller 300 may determine whether the high voltage battery 100 is in a state of charge or a state of discharge. According to an exemplary embodiment, when the controller 300 determines that the high voltage battery 100 is in the state of discharge, the controller 300 may derive real discharge power of the high voltage battery 100, and may calculate the real discharge power as a percent of the available discharge power according to a current temperature and state of charge of the high voltage battery 100 stored in the storage 200. For example, if the real discharge power is 70 kW, and the available discharge power according to the current temperature and state of charge of the high voltage battery 100 stored in the storage 200 is 100 kW, the controller 300 may calculate the real discharge power as 70% of the available discharge power. Here, the reason why the real discharge power is calculated as the percentage of the available discharge power stored in the storage 200 is that the discharge duration in which the discharge of the high voltage battery 100 may be sustained is varied depending on the real discharge power. In other words, the smaller the real discharge power, the longer the time for which the discharge may be sustained by the corresponding discharge power.

The ratio of the real discharge power to the available discharge power is calculated according to the method described above, and the controller 300 may compare the discharge duration of the high voltage battery 100 with a preset time and change the available discharge power of the high voltage battery 100 based on the real discharge power of the high voltage battery 100 and a discharge power limiting factor when the discharge duration exceeds the preset time.

Here, the preset time may vary depending on the real discharge power of the high voltage battery 100. For example, the smaller the real discharge power, the longer the preset time, and the larger the real discharge power, the shorter the preset time.

Further, the discharge power limiting factor may be calculated based on information on whether the high voltage battery 100 has reached a lower limit value when the high voltage battery 100 is controlled by the discharge duration of the high voltage battery 100, the current discharge amount of the high voltage battery 100, and limited available discharge power. For example, when a sudden power limitation occurs because the high power battery reaches the lower limit value thereof due to deterioration of the battery or the like even though the available discharge power changed based on the real discharge power and the discharge power limiting factor of the high voltage battery 100 is applied, it is possible to further increase a limiting rate based on the corresponding learning result when limiting the available discharge power later by analyzing these accumulated cases.

As described above, according to the present disclosure, it is possible to proactively protect the high voltage battery 100 so that the high voltage battery 100 does not reach the lower limit value thereof by actively changing the available discharge power based on the information on whether or not the high voltage battery 100 reaches the lower limit value thereof when the high voltage battery 100 is controlled by the current discharge duration, the current discharge amount, and the current limited available discharge power of thereof, rather than controlling the available discharge power of the high voltage battery according to the value stored in the map as in the related art.

Meanwhile, if the discharge duration of the high voltage battery 100 is a preset value or less, the controller 300 may maintain the available discharge power of the high voltage battery 100 at the maximum available discharge power according to the temperature and state of charge of the high voltage battery 100 pre-stored in the storage 200.

According to another exemplary embodiment, when the controller 300 determines that the high voltage battery 100 is in the state of charge, the controller 300 may derive real charge power of the high voltage battery 100, and may calculate the real discharge power as a percent of the available charge power according to the current temperature and state of charge of the high voltage battery 100 stored in the storage 200. Here, the reason why the real charge power is calculated as the percentage of the available charge power stored in the storage 200 is that a duration in which the charge of the high voltage battery 100 may be sustained is varied depending on the real charge power. That is, the smaller the real charge power, the longer the time for which the charge may be sustained by the corresponding charge power.

A ratio of the real charge power of the high voltage battery 100 to the available charge power is calculated according to the method described above, and the controller 300 may compare the charge duration of the high voltage battery 100 with a preset time and change the available charge power of the high voltage battery 100 based on the real charge power of the high voltage battery 100 and a charge power limiting factor when the charge duration exceeds the preset time.

Here, the preset time may vary depending on the real charge power of the high voltage battery 100. For example, the smaller the real charge power, the longer the preset time, and the larger the real charge power, the shorter the preset time.

Further, the charge power limiting factor may be calculated based on information on whether the high voltage battery 100 has reached an upper limit value thereof when the high voltage battery 100 is controlled by the charge duration of the high voltage battery 100, the current charge amount of the high voltage battery 100, and limited available charge power.

As described above, according to the present disclosure, it is possible to proactively protect the high voltage battery 100 so that the high voltage battery 100 does not reach the upper limit value thereof by actively changing the available charge power based on the information on whether or not the high voltage battery 100 reaches the lower limit value thereof when the high voltage battery 100 is controlled by the current charge duration, the current charge amount, and the current limited available discharge power of thereof, rather than controlling the available discharge power of the high voltage battery according to the value stored in the map as in the related art.

Meanwhile, if the charge duration of the high voltage battery 100 is a preset value or less, the controller 300 may maintain the available charge power of the high voltage battery 100 at the maximum available charge power according to the temperature and state of charge of the high voltage battery 100 pre-stored in the storage 200.

Hereinafter, an operation of the controller 300 changing the available charge and discharge power of the high voltage battery 100 according to an accumulated charge and discharge amount of the high voltage battery 100 will be described with referent to FIG. 5.

As illustrated in FIG. 5, if the controller 300 determines that the high voltage battery 100 is in the state of discharge, the controller 300 may calculate the accumulated discharge amount of the high voltage battery 100, and may determine whether or not the calculated total accumulated discharge amount exceeds a preset total accumulated discharge amount. If the calculated total accumulated discharge amount exceeds the preset total accumulated discharge amount, the controller 300 may calculate an exceed ratio of the accumulated discharge amount, and may change the available discharge power of the high voltage battery 100 based on the real discharge power of the high voltage battery 100 and the discharge power limiting factor. Here, the discharge power limiting factor may be a value calculated based on information on whether the high voltage battery 100 has reached a lower limit value when the high voltage battery 100 is controlled by the exceed ratio of the accumulated discharge amount and limited available discharge power.

Further, if the calculated total accumulated discharge amount is the preset total accumulated discharge amount or less, the controller 300 may sustain the available discharge power of the high voltage battery 100 at the maximum available discharge power according to the temperature and state of charge of the high voltage battery 100 pre-stored in the storage 200.

Meanwhile, according to another exemplary embodiment, if the controller 300 determines that the high voltage battery 100 is in the state of charge, the controller 300 may calculate the accumulated charge amount of the high voltage battery 100, and may determine whether or not the calculated total accumulated charge amount exceeds a preset total accumulated charge amount. If the calculated total accumulated charge amount exceeds the preset total accumulated charge amount, the controller 300 may calculate an exceed ratio of the accumulated charge amount, and may change the available charge power of the high voltage battery 100 based on the real charge power of the high voltage battery 100 and the charge power limiting factor. Here, the charge power limiting factor may be a value calculated based on information on whether the high voltage battery 100 has reached an upper limit value when the high voltage battery 100 is controlled by the exceed ratio of the accumulated charge amount and limited available charge power.

Further, if the calculated total accumulated charge amount is the preset total accumulated charge amount or less, the controller 300 may sustain the available discharge power of the high voltage battery 100 at the maximum available charge power according to the temperature and state of charge of the high voltage battery 100 pre-stored in the storage 200.

Hereinafter, an operation of the controller 300 changing the available discharge power of the high voltage battery 100 based on an output requesting amount of a vehicle will be described with reference to FIGS. 6 and 7.

As illustrated in FIG. 6, the controller 300 may determine a requested output amount of the vehicle based on at least one of vehicle speed information of the vehicle, accelerator pedaling amount information, and gradient information of a road on which the vehicle drives. Further, according to an exemplary embodiment, the controller 300 may determine the requested output amount of the vehicle in consideration of a learned driving pattern of a driver in addition to at least one of the vehicle speed information of the vehicle, the accelerator pedaling amount information, and the gradient information of the road on which the vehicle drives. For example, if the driving pattern of the driver is learned to enjoy rapid acceleration, the controller 300 may apply a higher requested output amount of the vehicle.

Meanwhile, if the requested output amount of the vehicle determined based on the conditions described above is a preset value or more, the controller 300 may change the available discharge power of the high voltage battery 100 based on a time required for the determined requested output amount and a requested output amount changing factor.

Hereinafter, an operation of the controller 300 changing the available discharge power of the high voltage battery 100 based on the time required for the determined requested output amount and the requested output amount changing factor will be described in detail with reference to FIG. 7.

Meanwhile, when the determined requested output amount of the vehicle is a preset value or more, it means that the requested output amount of the vehicle is relatively large. For example, when the vehicle takes off in a stationary state, rapidly accelerates, or drives on an uphill road based on the above-described information or the like, the requested output amount of the vehicle may be large.

Further, the requested output changing factor may be a value that may be changed depending on the requested output amount of the vehicle, and may have a value of 1 or more.

Referring to FIG. 7, if the controller 300 determines that the requested output amount of the vehicle is relatively large when it is normal to continuously discharge the maximum available discharge power based on the current state of charge and temperature of the battery for a preset amount of time (e.g., A seconds), the controller 300 may change the available discharge power of the high voltage battery 100 to be larger than the maximum available discharge power stored in the storage 200 during a first half period (from 0 second to A/2 seconds) based on the requested output amount changing factor. Further, the controller 300 may change the available discharge power of the high voltage battery 100 to be smaller than the maximum available discharge power stored in the storage 200 during a second half period (from A/2 seconds to A seconds).

As described above, according to aspects of the present disclosure, a power performance of a vehicle may be significantly improved by appropriately changing available discharge power of a high voltage battery 100 according to a requested output amount of the vehicle.

According to aspects of the present disclosure, a high voltage battery may be proactively protected so that the high voltage battery does not reach upper and lower limits of a voltage value thereof by controlling available charge and discharge power of the high voltage battery based on at least one information of information on a charge and discharge duration time of the high voltage battery, information on an accumulated charge and discharge amount thereof, and information on a required output amount of the vehicle, and the power performance may be improved by supplying in excess of available power as needed.

Although the present disclosure has been shown and described with respect to specific embodiments, it will be apparent to those having ordinary skill in the art that the present disclosure may be variously modified and altered without departing from the spirit and scope of the present disclosure as defined by the following claims.

What is claimed is:

1. A system of controlling an output of a high voltage battery for an eco-friendly vehicle, the system comprising:
   the high voltage battery mounted in the eco-friendly vehicle;
   a storage configured to store information on maximum available charge and discharge power according to a temperature and a state of charge (SOC) of the high voltage battery; and
   a controller configured to control available charge power and available discharge power of the high voltage battery based on at least one of information on a charge duration and a discharge duration of the high voltage battery, information on an accumulated charge amount and an accumulated discharge amount of the high voltage battery, and information on a requested output amount of the vehicle,
   wherein the controller is further configured to compare the discharge duration of the high voltage battery with a preset time and to change the available discharge power of the high voltage battery based on real discharge power of the high voltage battery and a discharge power limiting factor when the discharge duration exceeds the preset time.

2. The system of claim 1, wherein the controller is further configured to:
   calculate the real discharge power of the high voltage battery as a percentage of the available discharge power according to a current temperature and a state of charge of the high voltage battery stored in the storage when the high voltage battery is in a state of discharge.

3. The system of claim 2, wherein the discharge power limiting factor is calculated based on information on whether the high voltage battery has reached a lower limit value when the high voltage battery is controlled by the discharge duration of the high voltage battery, a current discharge amount of the high voltage battery, and limited available discharge power.

4. The system of claim 2, wherein the preset time varies depending on the real discharge power of the high voltage battery.

5. The system of claim 2, wherein when the discharge duration of the high voltage battery is a preset value or less, the controller is further configured to maintain the available discharge power of the high voltage battery at the maximum available discharge power according to the temperature and the state of charge of the high voltage battery pre-stored in the storage.

6. The system of claim 1, wherein the controller is further configured to:
   calculate real charge power of the high voltage battery as a percentage of the available charge power according to a current temperature and a state of charge of the high voltage battery stored in the storage when the high voltage battery is in a state of charge, and
   change the available charge power of the high voltage battery based on the real charge power of the high voltage battery and a charge power limiting factor when the charge duration exceeds a preset time.

7. The system of claim 6, wherein the charge power limiting factor is calculated based on information on whether the high voltage battery has reached an upper limit value when the high voltage battery is controlled by the charge duration of the high voltage battery, a current charge amount of the high voltage battery, and limited available charge power.

8. The system of claim 6, wherein the preset time varies depending on the real charge power of the high voltage battery.

9. The system of claim 6, wherein when the charge duration of the high voltage battery is a preset value or less, the controller is further configured to maintain the available charge power of the high voltage battery at the maximum available charge power according to the temperature and the state of charge of the high voltage battery pre-stored in the storage.

10. The system of claim 1, wherein the controller is further configured to:
   calculate an accumulated discharge amount of the high voltage battery when the high voltage battery is in a state of discharge,
   calculate an exceed ratio of the accumulated discharge amount when the calculated accumulated discharge amount exceeds a preset accumulated discharge amount, and
   change the available discharge power of the high voltage battery based on the real discharge power of the high voltage battery and a discharge power limiting factor.

11. The system of claim 10, wherein the discharge power limiting factor is calculated based on information on whether the high voltage battery has reached a lower limit value when the high voltage battery is controlled by the exceed ratio of the accumulated discharge amount of the high voltage battery and limited available discharge power.

12. The system of claim 10, wherein when the calculated accumulated discharge amount is the preset accumulated discharge amount or less, the controller is further configured to maintain the available discharge power of the high voltage battery at the maximum available discharge power according to the temperature and the state of charge of the high voltage battery pre-stored in the storage.

13. The system of claim 1, wherein the controller is further configured to:
   calculate an accumulated charge amount of the high voltage battery when the high voltage battery is in a state of charge, calculates an exceed ratio of the accumulated charge amount when the calculated accumulated charge amount exceeds a preset accumulated charge amount, and
   change the available charge power of the high voltage battery based on real charge power of the high voltage battery and a charge power limiting factor.

14. The system of claim 13, wherein the charge power limiting factor is calculated based on information on whether the high voltage battery has reached an upper limit value when the high voltage battery is controlled by the exceed ratio of the accumulated charge amount of the high voltage battery and limited available charge power.

15. The system of claim 13, wherein when the calculated accumulated charge amount is the preset accumulated charge amount or less, the controller is further configured to maintain the available charge power of the high voltage battery at the maximum available charge power according to the temperature and the state of charge of the high voltage battery pre-stored in the storage.

16. The system of claim 1, wherein the requested output amount of the vehicle is determined based on at least one of vehicle speed information, accelerator pedaling amount information, and gradient information of a road on which the vehicle drives.

17. The system of claim 16, wherein the requested output amount of the vehicle is determined based on a learned driving pattern of a driver in addition to the at least one of the vehicle speed information, the accelerator pedaling amount information, and the gradient information of the road on which the vehicle drives.

18. The system of claim 1, wherein when the requested output amount of the vehicle is a preset value or more, the controller is further configured to change the available discharge power of the high voltage battery based on a time required for the requested output amount and a requested output amount changing factor.

19. The system of claim 18, wherein the requested output changing factor changes depending on the requested output amount of the vehicle, and has a value of 1 or more.

* * * * *